(12) United States Patent
Hashimoto

(10) Patent No.: US 8,304,348 B2
(45) Date of Patent: Nov. 6, 2012

(54) SEMICONDUCTOR DEVICE MANUFACTURING METHOD AND SEMICONDUCTOR DEVICE

(75) Inventor: Junichi Hashimoto, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 12/709,124

(22) Filed: Feb. 19, 2010

(65) Prior Publication Data

US 2011/0031630 A1    Feb. 10, 2011

(30) Foreign Application Priority Data

Aug. 4, 2009    (JP) .................................. 2009-181361

(51) Int. Cl.
*H01L 29/72*    (2006.01)

(52) U.S. Cl. ........ 438/700; 438/618; 438/622; 438/637; 438/639; 438/672; 439/675

(58) Field of Classification Search .................. 438/618, 438/622, 637, 639, 672, 675, 700
See application file for complete search history.

(56) References Cited

U.S. PATENT DOCUMENTS

| 2007/0134817 A1* | 6/2007 | Noda ................................ 438/3 |
| 2008/0121953 A1* | 5/2008 | Summerfelt ................... 257/295 |
| 2009/0317978 A1* | 12/2009 | Higashi ........................ 438/703 |

FOREIGN PATENT DOCUMENTS

JP    2007-180389    7/2007

* cited by examiner

*Primary Examiner* — Edward Wojciechowicz
(74) *Attorney, Agent, or Firm* — Finnegan, Henderson, Farabow, Garrett & Dunner, L.L.P.

(57) ABSTRACT

A semiconductor device manufacturing method includes: stacking a plurality of electrode layers containing a semiconductor alternately with insulating layers; processing part of a multilayer body of the electrode layers and the insulating layers into a staircase shape and exposing a surface of the staircase-shaped electrode layers; forming a metal film in contact with the exposed electrode layers; reacting the semiconductor of the electrode layers with the metal film to form a metal compound in at least a portion of the electrode layers in contact with the metal film; removing an unreacted portion of the metal film; forming an interlayer insulating layer covering the staircase-shaped electrode layers after removing the unreacted portion of the metal film; forming a plurality of contact holes piercing the interlayer insulating layer, each of the contact holes reaching the metal compound of the electrode layer at a corresponding stage; and providing a plurality of contact electrodes inside the contact holes.

10 Claims, 12 Drawing Sheets

SEMICONDUCTOR DEVICE MANUFACTURING METHOD AND SEMICONDUCTOR DEVICE

CROSS-REFERENCE TO RELATED APPLICATIONS

This application is based upon and claims the benefit of priority from the prior Japanese Patent Application No. 2009-181361, filed on Aug. 4, 2009; the entire contents of which are incorporated herein by reference.

BACKGROUND OF THE INVENTION

1. Field of the Invention

This invention relates to a semiconductor device manufacturing method and a semiconductor device.

2. Background Art

A technique for three-dimensionally arranging memory cells is proposed in, for instance, JP-A 2007-180389 (Kokai). In this technique, a plurality of electrode layers functioning as control gates in a memory device are stacked alternately with insulating layers to form a multilayer body, in which silicon pillars are provided via a charge storage layer.

JP-A 2007-180389 (Kokai) also discloses a staircase structure of electrode layers as a structure for connecting each of a plurality of stacked electrode layers to an upper interconnect. In other words, toward the bottom, each of the electrode layers is made longer. Furthermore, a contact hole reaching each of the electrode layers is formed in an interlayer insulating layer covering the staircase structure, and a contact electrode is buried in the contact hole.

JP-A 2007-180389 (Kokai) further discloses forming a trench in a multilayer body of a memory cell array region to expose the side surface of each of the electrode layers into the trench, forming a metal film in the trench, and then performing annealing to turn the side surface of each of the electrode layers made of silicon into metal silicide. It is desired to turn also the electrode layers of the staircase-shaped contact portion into metal silicide to reduce resistance. However, the staircase-shaped contact portion is different from the memory cell array in its structure and formation process. Thus, the metal silicidation process for the memory cell array cannot be directly applied thereto.

SUMMARY OF THE INVENTION

According to an aspect of the invention, there is provided a semiconductor device manufacturing method including: stacking a plurality of electrode layers containing a semiconductor alternately with insulating layers; processing part of a multilayer body of the electrode layers and the insulating layers into a staircase shape and exposing a surface of the staircase-shaped electrode layers; forming a metal film in contact with the exposed electrode layers; reacting the semiconductor of the electrode layers with the metal film to form a metal compound in at least a portion of the electrode layers in contact with the metal film; removing an unreacted portion of the metal film; forming an interlayer insulating layer covering the staircase-shaped electrode layers after removing the unreacted portion of the metal film; forming a plurality of contact holes piercing the interlayer insulating layer, each of the contact holes reaching the metal compound of the electrode layer at a corresponding stage; and providing a plurality of contact electrodes inside the contact holes.

According to another aspect of the invention, there is provided a semiconductor device including: a multilayer body of a plurality of electrode layers containing a semiconductor stacked alternately with a plurality of insulating layers, part of the multilayer body being processed into a staircase shape, the multilayer body having a metal compound of the semiconductor and a metal formed in at least an upper surface and an end portion of the staircase-shaped electrode layers; an interlayer insulating layer covering the staircase-shaped electrode layers; and a plurality of contact electrodes provided inside a plurality of contact holes piercing the interlayer insulating layer, each of the contact holes reaching the metal compound of the electrode layer at a corresponding stage.

DETAILED DESCRIPTION

Figure 1:
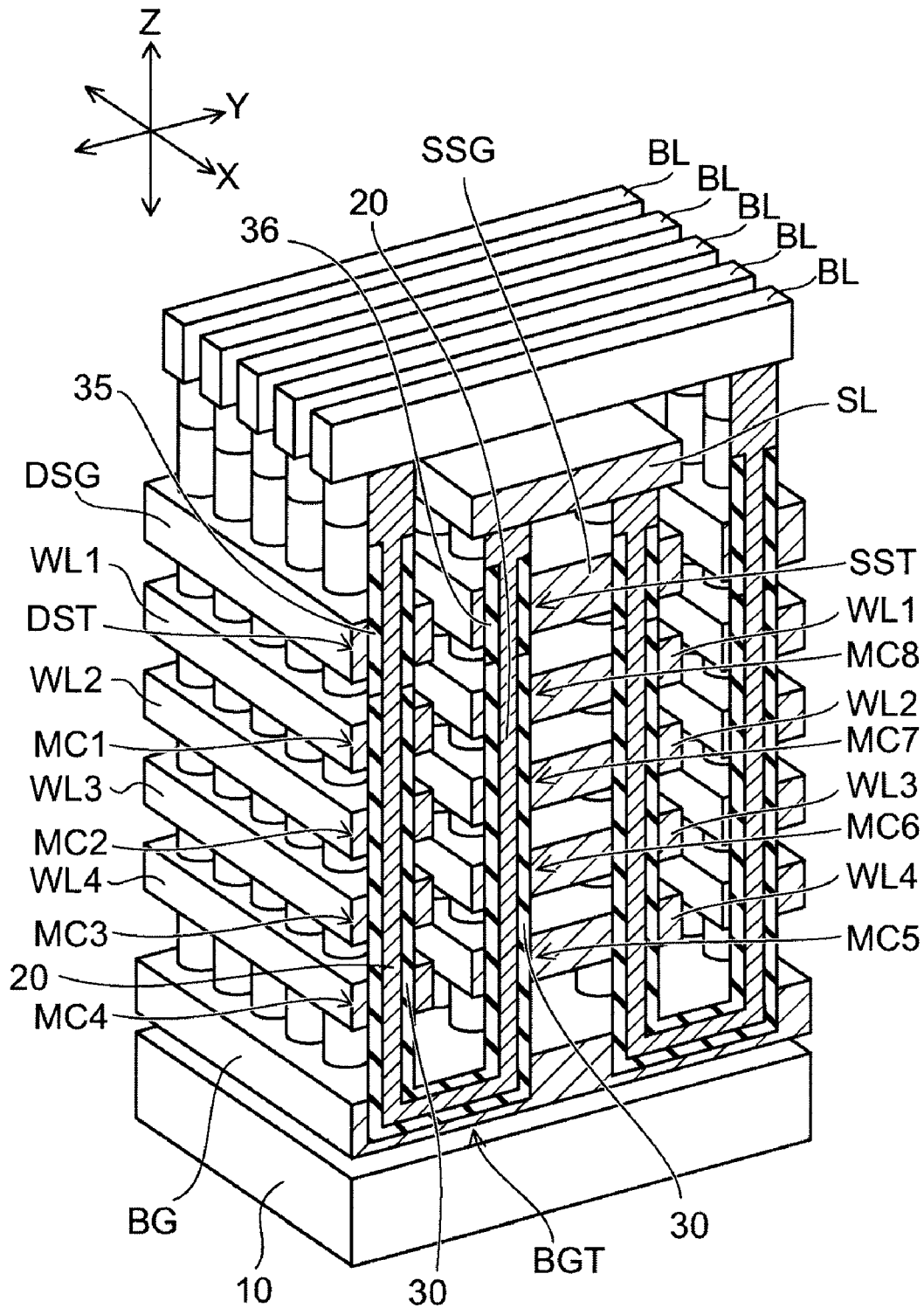
FIG. 1 is a schematic view illustrating the configuration of a memory cell array in a semiconductor device according to an embodiment of the invention.

FIG. 1 is a schematic view illustrating the configuration of a memory cell array in a semiconductor device according to an embodiment of the invention. In FIG. 1, for clarity of illustration, insulating portions are not shown, except insulating films in a memory hole. Although a semiconductor is illustratively silicon in the following embodiments, semiconductors other than silicon may also be used.

In this specification, for convenience of description, an XYZ orthogonal coordinate system is introduced. In this coordinate system, the two directions parallel to the major surface of a substrate 10 and orthogonal to each other are referred to as X and Y directions, and the direction orthogonal to both the X and Y directions is referred to as a Z direction. A plurality of electrode layers WL1-WL4 are stacked in the Z direction.

A back gate BG is provided on the substrate 10 via an insulating layer, not shown. The back gate BG is illustratively a silicon layer provided with conductivity by impurity doping. A plurality of electrode layers WL1-WL4 and a plurality of insulating layers, not shown, are alternately stacked on the back gate BG. The number of electrode layers WL1-WL4 is arbitrary, and the case of four layers is illustrated in this embodiment. The electrode layers WL1-WL4 are illustratively silicon layers provided with conductivity by impurity doping.

The electrode layers WL1-WL4 are divided into a plurality of blocks by trenches extending in the X direction. A drain-side select gate DSG is provided via an insulating layer, not shown, on the uppermost electrode layer WL1 in one block. The drain-side select gate DSG is illustratively a silicon layer provided with conductivity by impurity doping. A source-side select gate SSG is provided via an insulating layer, not shown, on the uppermost electrode layer WL1 in another block neighboring the former block. The source-side select gate SSG is illustratively a silicon layer provided with conductivity by impurity doping.

A source line SL is provided on the source-side select gate SSG via an insulating layer, not shown. The source line SL is illustratively a silicon layer provided with conductivity by impurity doping. A plurality of bit lines BL are provided via an insulating layer, not shown, on the source line SL and the drain-side select gate DSG. Each of the bit lines BL extends in the Y direction.

A plurality of U-shaped memory holes are formed in the aforementioned multilayer body on the substrate 10. In the block including the drain-side select gate DSG, a memory hole extending in the Z direction is formed through the drain-side select gate DSG and the underlying electrode layers WL1-WL4. In the block including the source-side select gate SSG, a memory hole extending in the Z direction is formed through the source-side select gate SSG and the underlying electrode layers WL1-WL4. These memory holes are connected to each other via a memory hole formed in the back gate BG and extending in the Y direction.

A silicon body 20 is provided as a U-shaped semiconductor layer inside the memory holes. A gate insulating film 35 is formed on the inner wall of the memory hole between the drain-side select gate DSG and the silicon body 20. A gate insulating film 36 is formed on the inner wall of the memory hole between the source-side select gate SSG and the silicon body 20. An insulating film 30 is formed on the inner wall of the memory hole between each of the electrode layers WL1-WL4 and the silicon body 20. The insulating film 30 is formed also on the inner wall of the memory hole between the back gate BG and the silicon body 20. The insulating film 30 illustratively has an ONO (oxide-nitride-oxide) structure in which a silicon nitride film is sandwiched between a pair of silicon oxide films.

Figure 2:
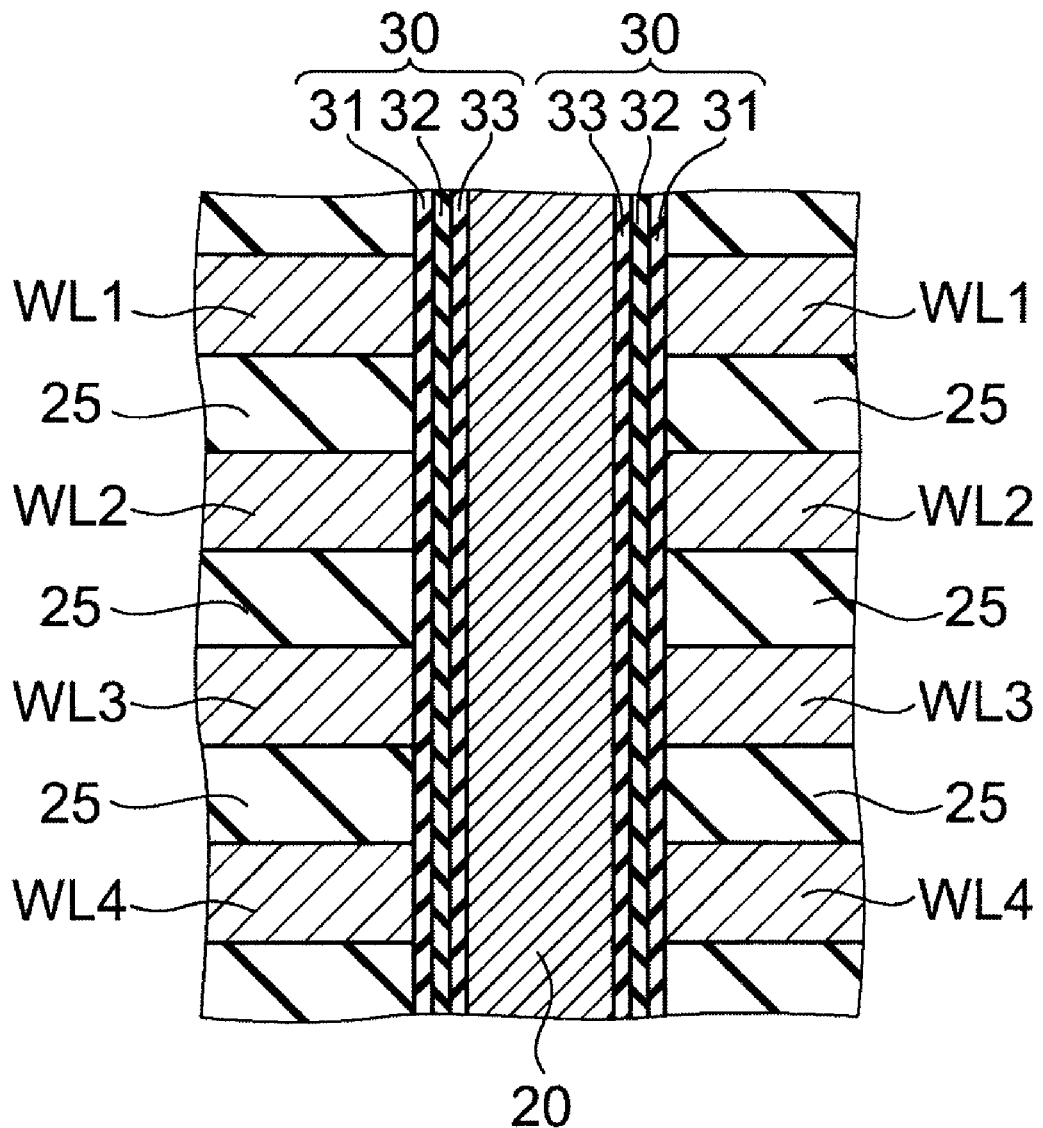
FIG. 2 is an enlarged cross-sectional view of the main portion in the memory cell array.

FIG. 2 shows an enlarged cross section of the portion where the silicon body 20 pierces the electrode layers WL1-WL4 and inter-electrode insulating layers 25.

Between the electrode layers WL1-WL4 and the silicon body 20, a first insulating film 31, a charge storage layer 32, and a second insulating film 33 are provided sequentially from the electrode layers WL1-WL4 side. The first insulating film 31 is in contact with the electrode layers WL1-WL4, the second insulating film 33 is in contact with the silicon body 20, and the charge storage layer 32 is provided between the first insulating film 31 and the second insulating film 33.

The silicon body 20 functions as a channel, the electrode layers WL1-WL4 function as a control gate, and the charge storage layer 32 functions as a data storage layer for storing charge injected from the silicon body 20. In other words, at each intersection between the silicon body 20 and the electrode layers WL1-WL4, a memory cell having a structure, which the control gate surrounds the channel, is formed.

The semiconductor device according to this embodiment is a nonvolatile semiconductor memory device in which electrical erasure/writing of data can be freely performed, and the stored content can be retained even after power off. For instance, the memory cell is one having a charge trap structure. The charge storage layer 32 includes numerous traps for confining charges (electrons) and is illustratively made of silicon nitride film. The second insulating film 33 is illustratively made of silicon oxide film and serves as a potential barrier when charge is injected from the silicon body 20 into the charge storage layer 32 or when the charge stored in the charge storage layer 32 diffuses into the silicon body 20. The first insulating film 31 is illustratively made of silicon oxide film and prevents the charge stored in the charge storage layer 32 from diffusing into the electrode layers WL1-WL4.

Referring again to FIG. 1, a gate insulating film 35 is provided between the drain-side select gate DSG and the silicon body 20 piercing the drain-side select gate DSG, and these constitute a drain-side select transistor DST. The upper end portion of the silicon body 20 projected upward from the drain-side select gate DSG is connected to each of the corresponding bit lines BL.

A gate insulating film 36 is provided between the source-side select gate SSG and the silicon body 20 piercing the source-side select gate SSG, and these constitute a source-side select transistor SST. The upper end portion of the silicon body 20 projected upward from the source-side select gate SSG is connected to the source line SL.

The back gate BG, the silicon body 20 provided in this back gate BG, and the insulating film 30 between the back gate BG and the silicon body 20 constitute a back gate transistor BGT.

A memory cell MC1 with the electrode layer WL1 serving as a control gate, a memory cell MC2 with the electrode layer WL2 serving as a control gate, a memory cell MC3 with the electrode layer WL3 serving as a control gate, and a memory cell MC4 with the electrode layer WL4 serving as a control gate are provided between the drain-side select transistor DST and the back gate transistor BGT.

A memory cell MC5 with the electrode layer WL4 serving as a control gate, a memory cell MC6 with the electrode layer WL3 serving as a control gate, a memory cell MC7 with the electrode layer WL2 serving as a control gate, and a memory cell MC8 with the electrode layer WL1 serving as a control gate are provided between the back gate transistor BGT and the source-side select transistor SST.

The drain-side select transistor DST, the memory cells MC1-MC4, the back gate transistor BGT, the memory cells MC5-MC8, and the source-side select transistor SST are series connected to constitute one memory string. A plurality of such memory strings are arranged in the X and Y directions, and thereby a plurality of memory cells MC1-MC8 are three-dimensionally provided in the X, Y, and Z directions.

Figure 11A:
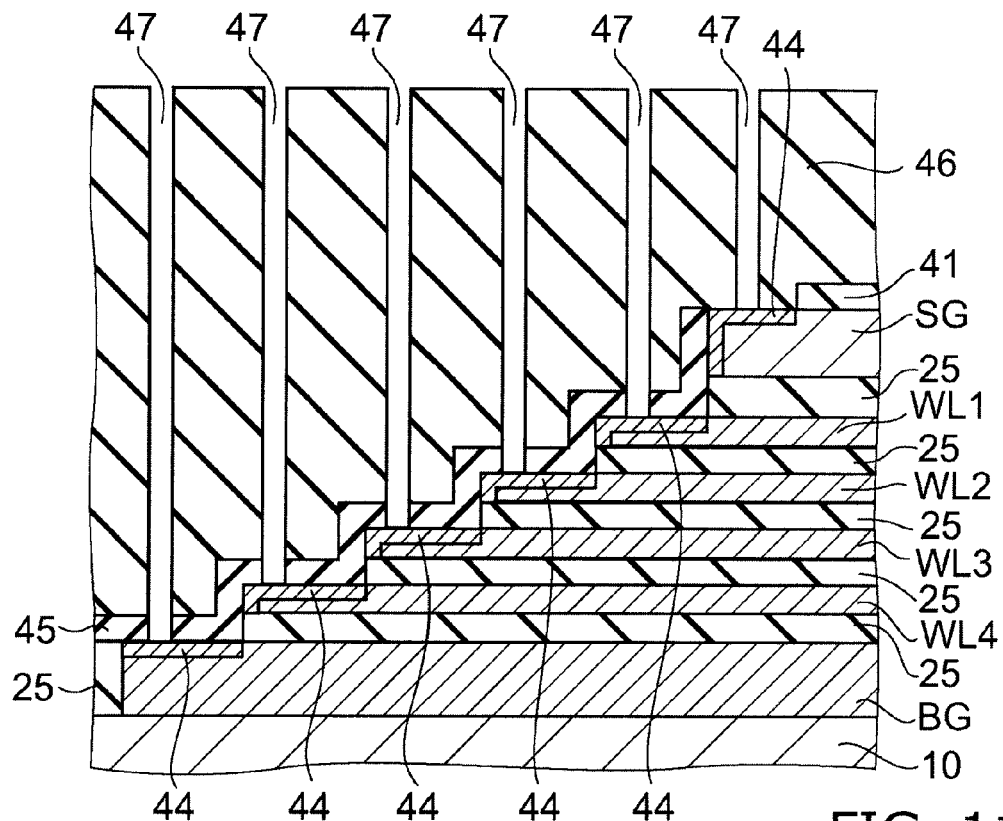
Figure 11B:
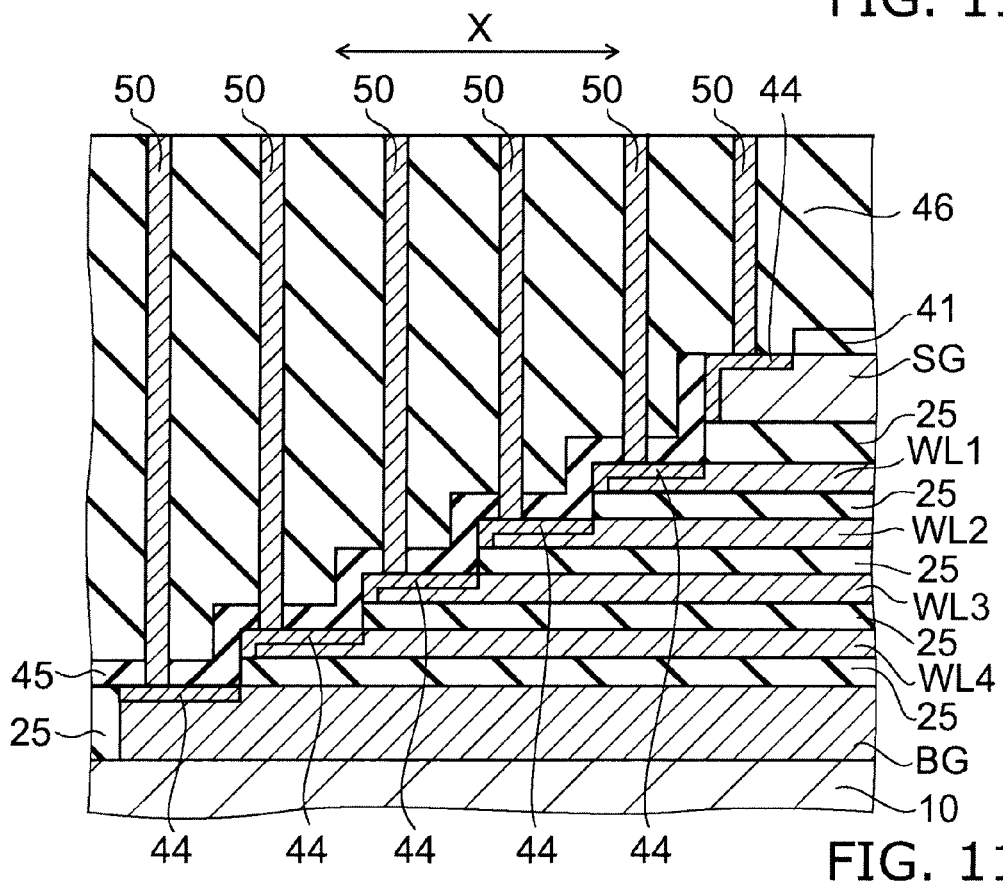

FIG. 11B shows a cross-sectional structure of a contact region for connecting each of the silicon layers (drain-side select gate DSG, source-side select gate SSG, electrode layers WL1-WL4, and back gate BG) to an upper interconnect, not shown. As viewed in the X direction, this contact region is located outside the memory cell array region shown in FIG. 1.

In FIG. 11 B, the inter-electrode insulating layer omitted in FIG. 1 is shown as insulating layers 25. The select gate SG in FIG. 11 B corresponds to the drain-side select gate DSG or the source-side select gate SSG in FIG. 1.

Part of the aforementioned multilayer body is processed into a staircase shape in the contact region. In other word, toward the bottom, each of the silicon layers extends farther outward in the X direction. At least the surface of each of the silicon layers in the staircase structure portion is turned into a metal compound.

For instance, titanium silicide 44 is formed in the upper surface of the back gate BG at the lowermost stage. Titanium silicide 44 is formed in the upper surface and end surface of the electrode layer WL4 at the next higher stage. Titanium silicide 44 is formed in the upper surface and end surface of the electrode layer WL3 at the next higher stage. Titanium silicide 44 is formed in the upper surface and end surface of the electrode layer WL2 at the next higher stage. Titanium silicide 44 is formed in the upper surface and end surface of the electrode layer WL1 at the next higher stage. Titanium silicide 44 is formed in the upper surface and end surface of the select gate SG at the next higher stage.

Here, the silicon layer at each stage may be turned into titanium silicide not only in its upper surface and end surface, but also throughout the thickness.

The staircase structure portion is covered with a stopper layer 45, and an interlayer insulating layer 46 is provided on the stopper layer 45. For instance, the stopper layer 45 is made of silicon nitride, and the interlayer insulating layer 46 is made of silicon oxide.

A plurality of contact holes are formed in the interlayer insulating layer 46 and the stopper layer 45, and a contact electrode 50 is provided in each of the contact holes.

Figure 3A:
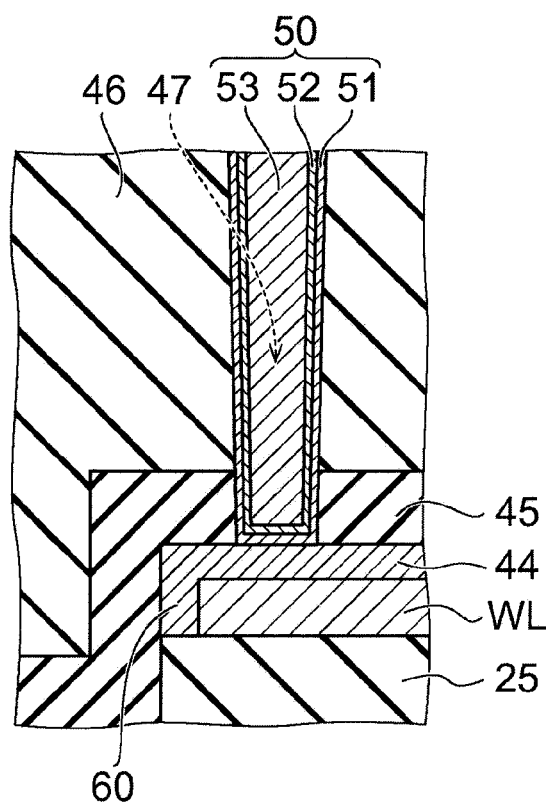
FIGS. 3A and 3B are schematic cross-sectional views of the connection structure of an electrode layer and contact electrode in the semiconductor device according to the embodiment of the invention.

FIG. 3A is an enlarged cross-sectional view of the contact electrode 50 provided on the electrode layers WL1-WL4, for instance. In FIG. 3A, the electrode layers WL1-WL4 are generically shown as an electrode layer WL.

A contact hole 47 pierces the interlayer insulating layer 46 and the stopper layer 45 and reaches the titanium silicide 44 of the electrode layer WL. A first barrier film 51 is provided on the inner wall (sidewall and bottom) of the contact hole 47, a second barrier film 52 is provided inside the first barrier film 51, a conductive material 53 is buried inside the second barrier film 52, and these constitute the contact electrode 50. For instance, the first barrier film 51 is a titanium film, the second barrier film 52 is a titanium nitride film, and the conductive material 53 is tungsten.

The electrode layer WL is connected to an upper interconnect, not shown, via the contact electrode 50. The electrode layer WL is illustratively a silicon layer, and titanium silicide 44 is formed in the portion of the electrode layer WL in contact with the contact electrode 50. Hence, the contact resistance to the contact electrode 50 can be reduced.

The contact hole 47 is mostly filled with the conductive material 53, which is a material having good filling capability, such as tungsten. Thus, the conductive material 53 can be sufficiently formed also at the bottom of the contact hole 47 particularly with high aspect ratio. Furthermore, this can avoid generation of voids and suppress the increase of resistance.

Furthermore, the first barrier film 51 and the second barrier film 52 serve to prevent the diffusion of tungsten into the interlayer insulating layer 46 and the stopper layer 45. This can prevent short circuit between adjacent contact electrodes 50 due to diffusion of tungsten into the interlayer insulating layer 46 and the stopper layer 45.

Here, the first barrier film 51 and the second barrier film 52 at the bottom of the contact hole 47 may be omitted. In other words, before the conductive material 53 is buried, the first barrier film 51 and the second barrier film 52 at the bottom of the contact hole 47 may be removed by RIE (Reactive Ion Etching).

The contact electrode 50 connected to the back gate BG and the contact electrode 50 connected to the select gate SG are configured likewise. The back gate BG and the select gate SG are each also electrically connected to an upper interconnect via a corresponding contact electrode 50.

Next, a method for forming a staircase-shaped contact structure portion in the semiconductor device according to this embodiment is described with reference to FIGS. 4A to 11B.

Figure 4A:
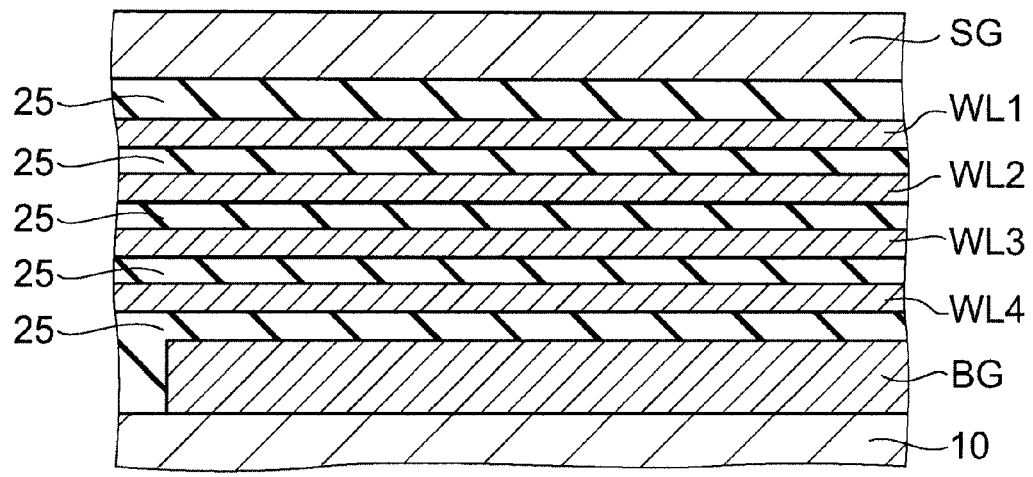
FIGS. 4A to 11B are schematic cross-sectional views illustrating a semiconductor device manufacturing method according to the embodiment of the invention.

First, a multilayer body shown in FIG. 4A is formed. Specifically, a back gate BG is formed on a substrate 10 and patterned. Then, insulating layers 25 and electrode layers WL1-WL4 are alternately stacked on the back gate BG. Furthermore, a select gate SG to serve as the aforementioned drain-side select gate DSG or source-side select gate SSG is formed on the uppermost insulating layer 25.

The back gate BG, the electrode layers WL1-WL4, and the select gate SG are illustratively silicon layers provided with conductivity by impurity doping, and the insulating layer 25 is a silicon oxide layer. These are formed illustratively by the CVD (chemical vapor deposition) process.

The formation of this multilayer body is followed by processes for forming memory cells MC1-MC8, drain-side select transistor DST, source-side select transistor SST, back gate transistor BGT and the like in the memory cell array region.

Figure 4B:
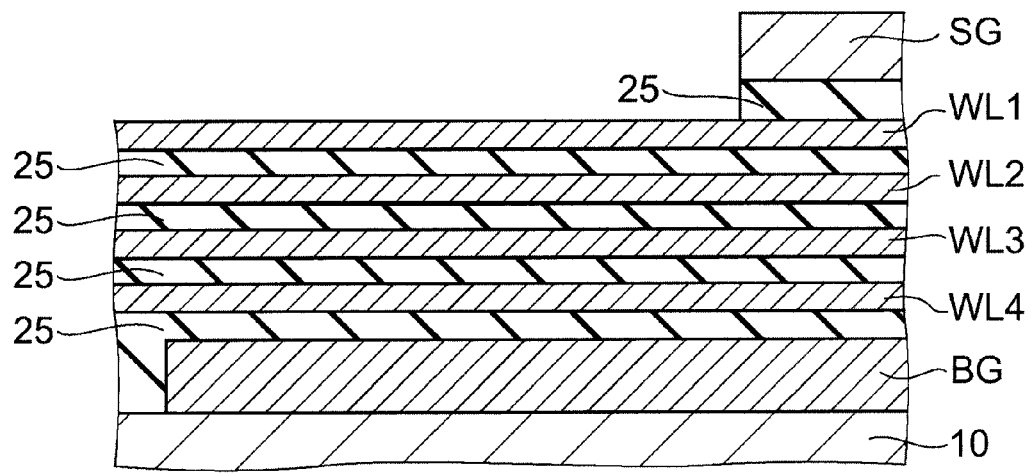

Subsequently, in the region where the staircase-shaped contact structure is to be formed, a resist mask, not shown, is used to perform patterning by selectively removing the select gate SG and the underlying insulating layer 25 as shown in FIG. 4B.

Figure 5A:
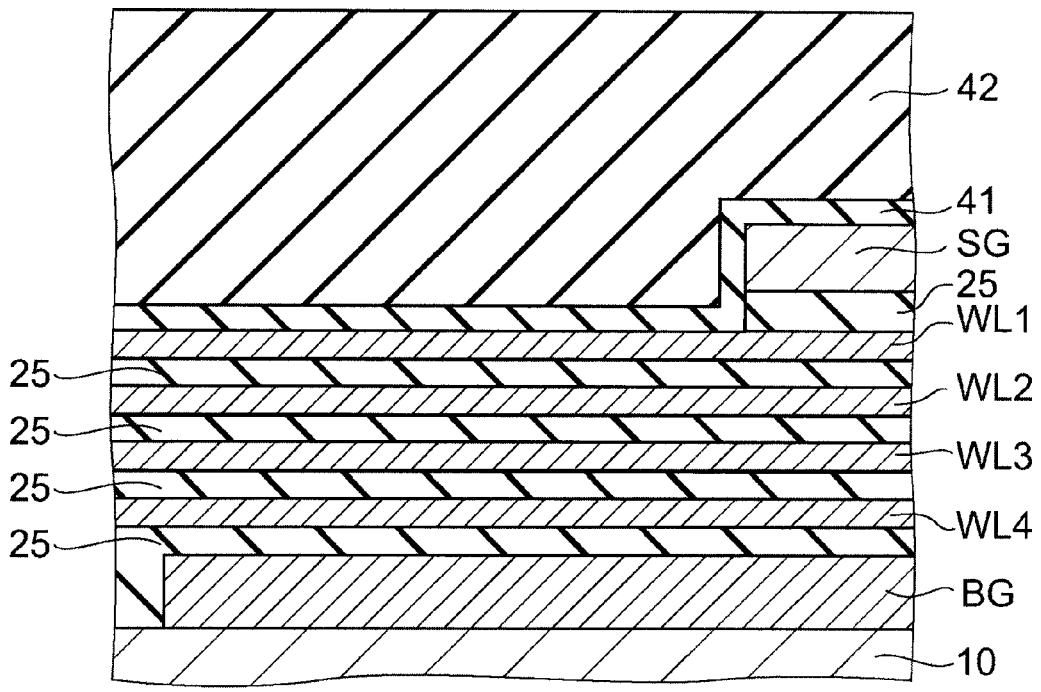

Subsequently, as shown in FIG. 5A, an insulating layer (such as a silicon oxide layer) 41 covering the upper surface of the multilayer body is formed, and then a resist film 42 is formed on the insulating layer 41.

Figure 5B:
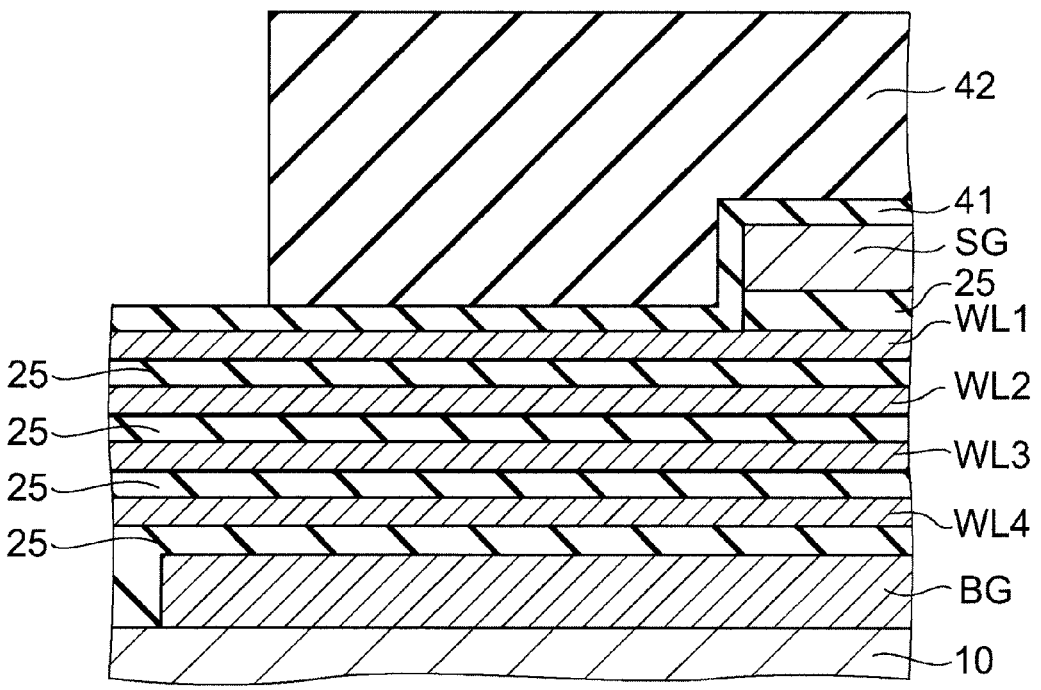

Next, a mask, not shown, is used to perform lithography and development on the resist film 42. Thus, as shown in FIG. 5B, the resist film 42 is patterned so that its end is located at a desired position.

Figure 6A:
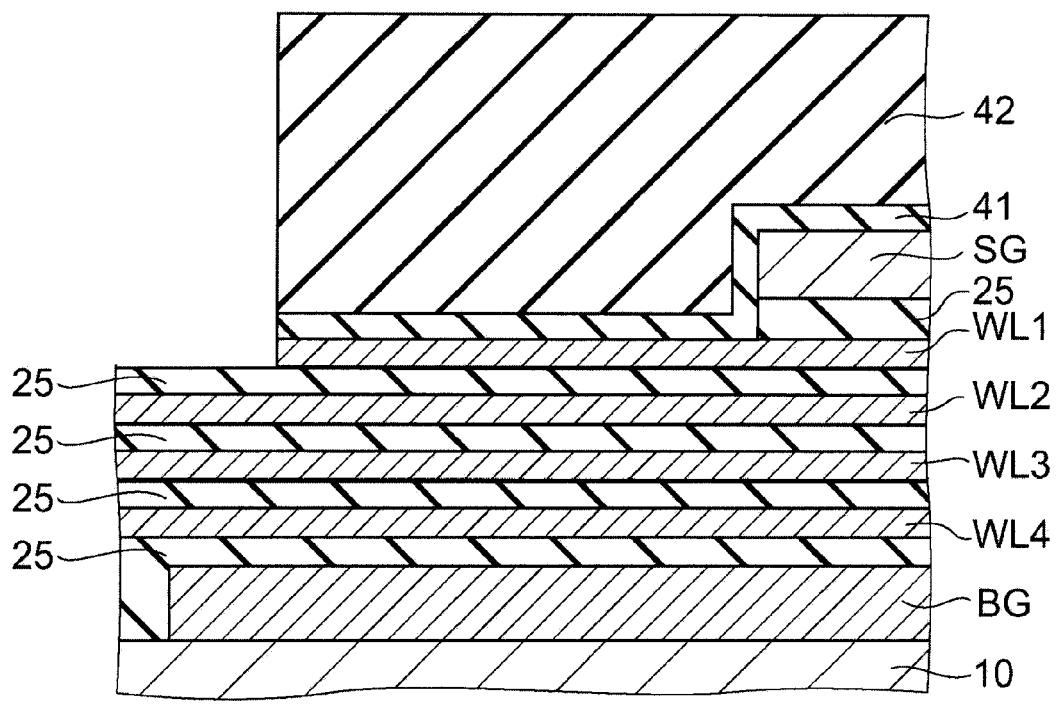

Next, the resist film 42 is used as a mask to perform RIE, thereby removing the portion of the insulating layer 41 and the underlying electrode layer WL1 exposed from the resist film 42 as shown in FIG. 6A.

Figure 6B:
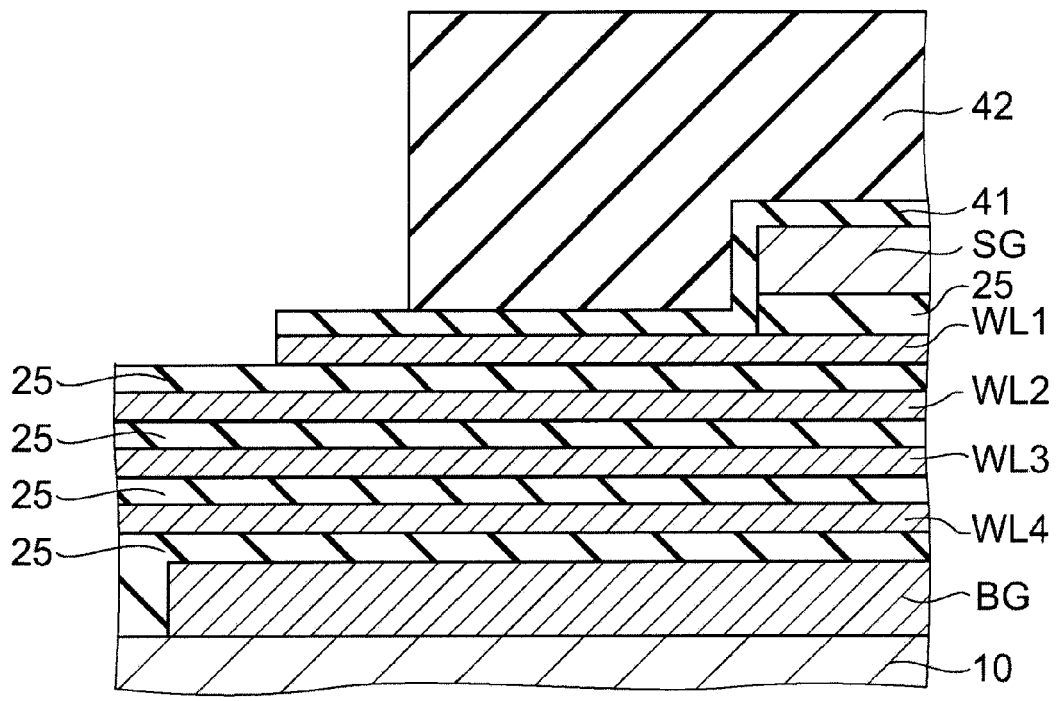

Next, resist slimming for reducing the planar size of the resist film 42 is performed. By this resist slimming, as shown in FIG. 6B, part of the surface of the insulating layer 41 is newly exposed.

Figure 7A:
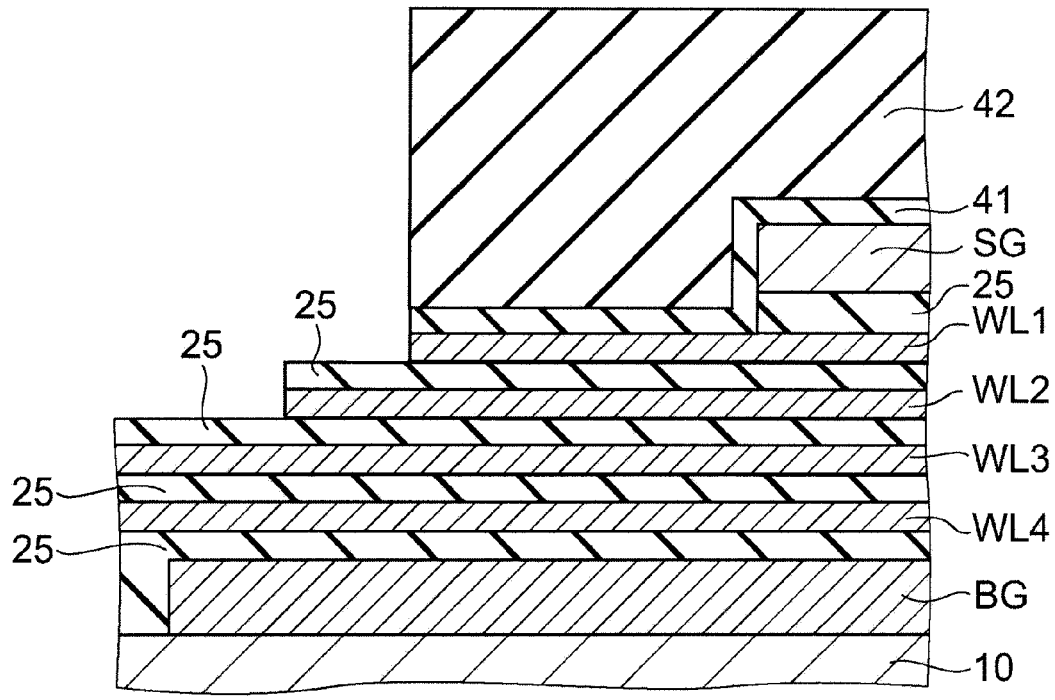
Figure 7B:
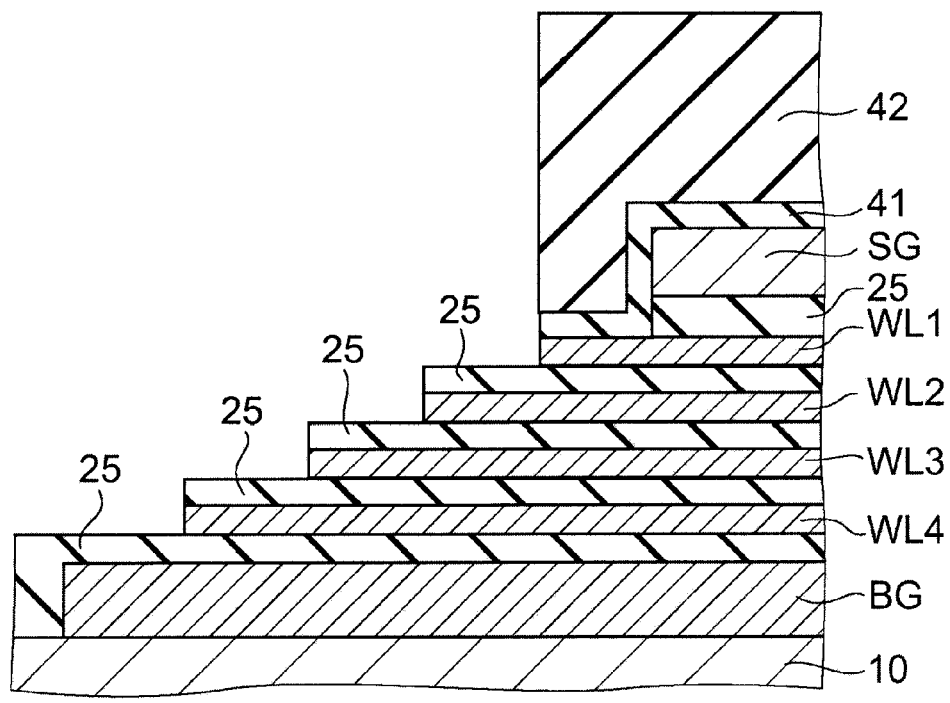

Then, the slimmed resist film 42 is used as a mask to perform RIE. As shown in FIG. 7A, this removes the insulating layer 25 and the underlying electrode layer WL2, which were located below the electrode layer WL1 removed by the previous etching, and also removes the insulating layer 41 and the underlying electrode layer WL1 exposed from the resist film 42 in the adjacent portion.

Subsequently, likewise, the process for slimming the resist film 42 and the process for etching one insulating layer and one underlying electrode layer in a portion not covered with and exposed from the slimmed resist film 42 are repeated. This results in a staircase structure shown in FIG. 7B.

Figure 8A:
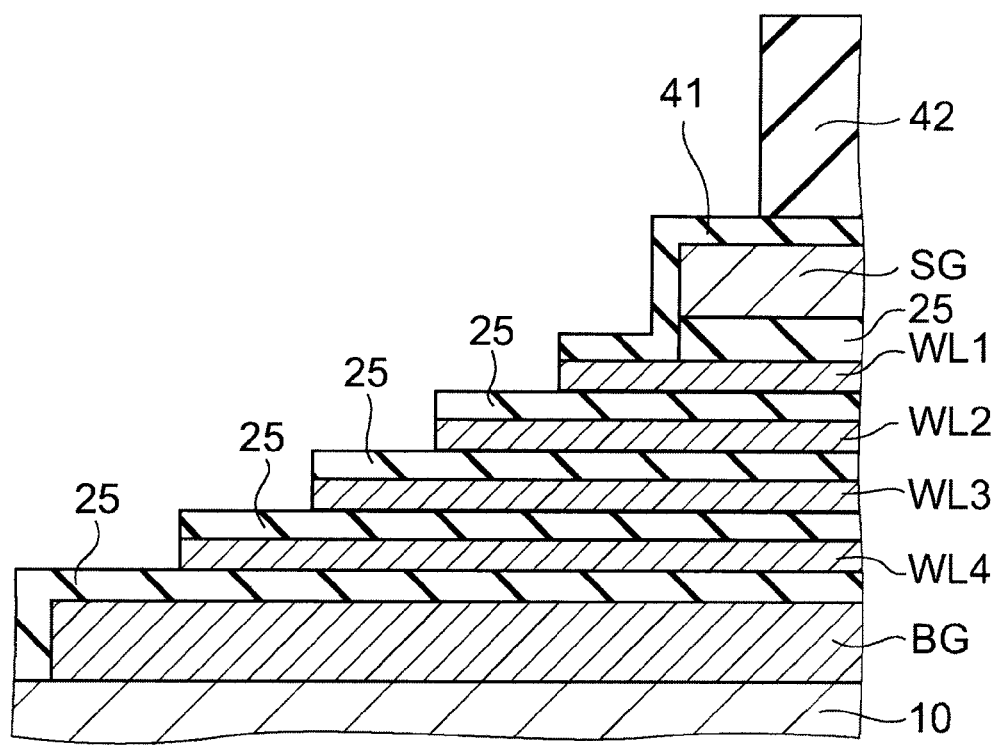
Figure 8B:
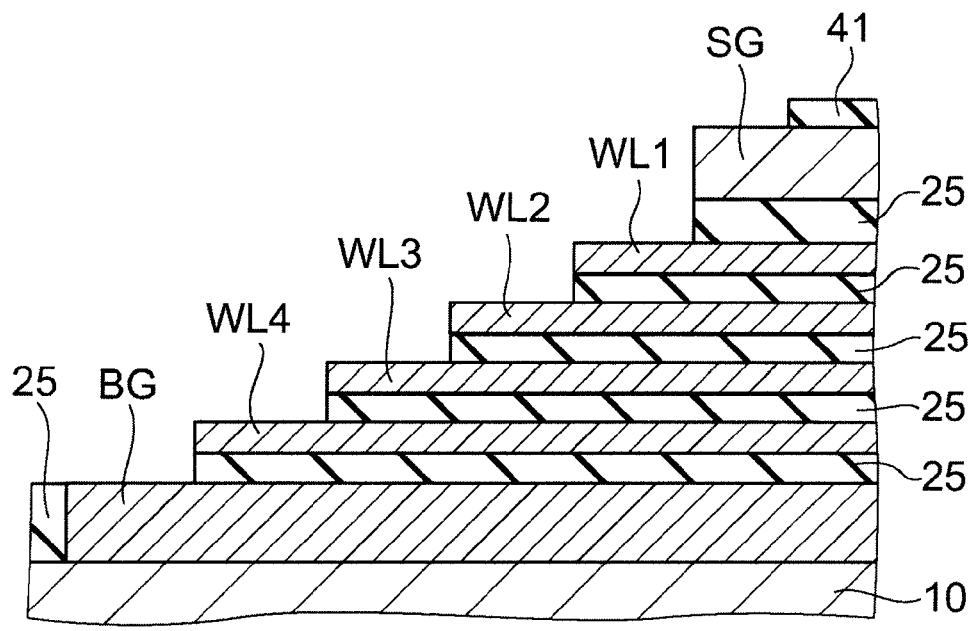

Subsequently, as shown in FIG. 8A, the resist film 42 is further slimmed, and the remaining resist film 42 is used as a mask to perform etching. This removes the insulating layers 41 and 25 covering the surface of the staircase structure portion. Thus, as shown in FIG. 8B, the select gate SG, the electrode layers WL1-WL4, and the back gate BG are partly exposed.

More specifically, at the lowermost stage, the upper surface of the back gate BG is exposed. At the next higher stage, the upper surface and end surface of the electrode layer WL4 are exposed. At the next higher stage, the upper surface and end surface of the electrode layer WL3 are exposed. At the next higher stage, the upper surface and end surface of the electrode layer WL2 are exposed. At the next higher stage, the upper surface and end surface of the electrode layer WL1 are exposed. At the next higher stage, the upper surface and end surface of the select gate SG are exposed.

Figure 9A:
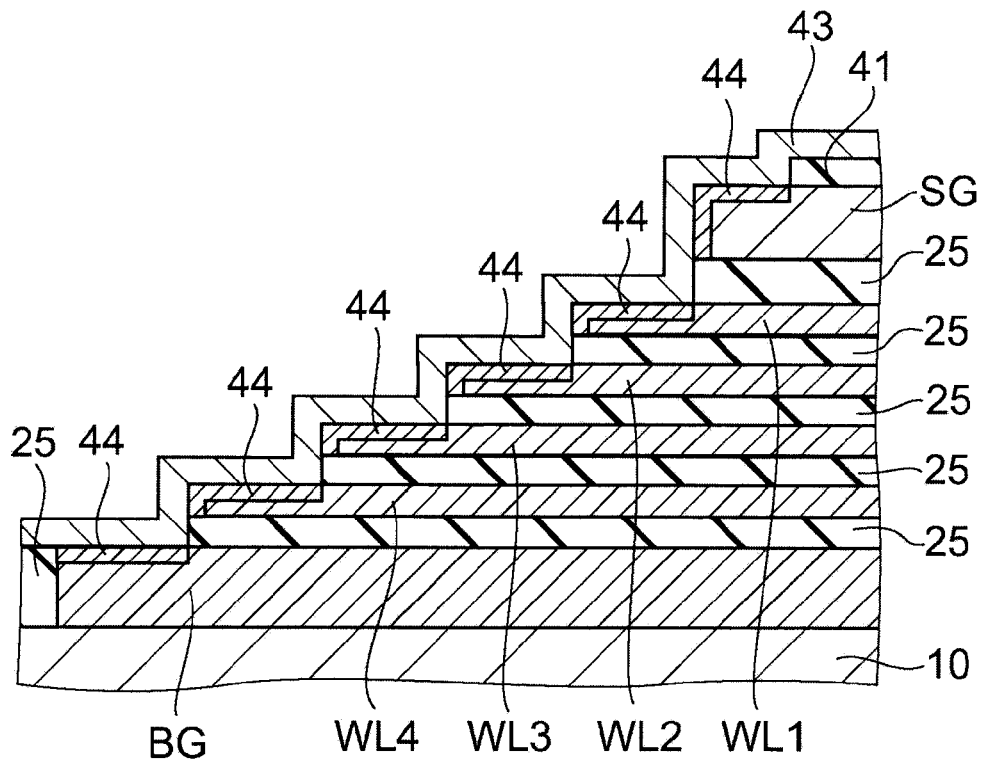

Next, as shown in FIG. 9A, the staircase structure portion is covered with a metal film 43. The metal film 43 is formed illustratively by a sputtering process. This embodiment is described by taking titanium (Ti) as an example of the material of the metal film 43. However, besides titanium, it is also possible to use other materials such as cobalt (Co), nickel (Ni), tantalum (Ta), platinum (Pt), palladium (Pd) and tungsten (W).

After the metal film 43 is formed, annealing (heat treatment) is performed to cause silicon contained in the select gate SG, the electrode layers WL1-WL4, and the back gate BG to react with titanium contained in the metal film 43. Thus, titanium silicide 44 is formed in the select gate SG, the electrode layers WL1-WL4, and the back gate BG, at least in the portion in contact with the metal film 43.

Figure 9B:
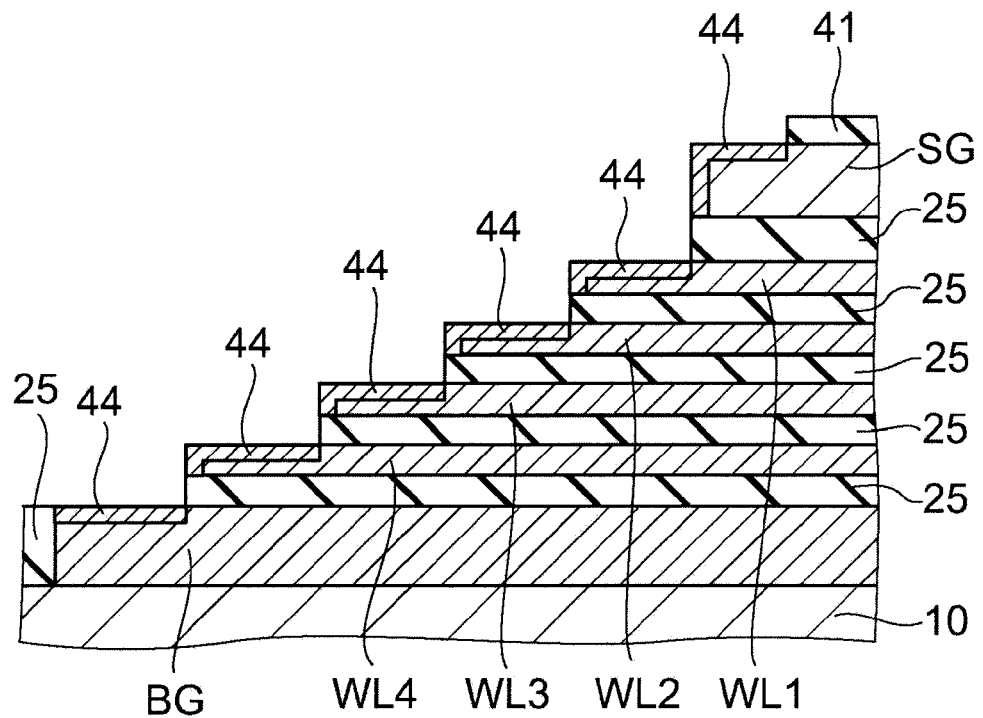

Subsequently, the unreacted portion of the metal film 43 is removed by wet processing. Thus, as shown in FIG. 9B, the titanium silicide 44 at each stage is exposed.

Figure 10A:
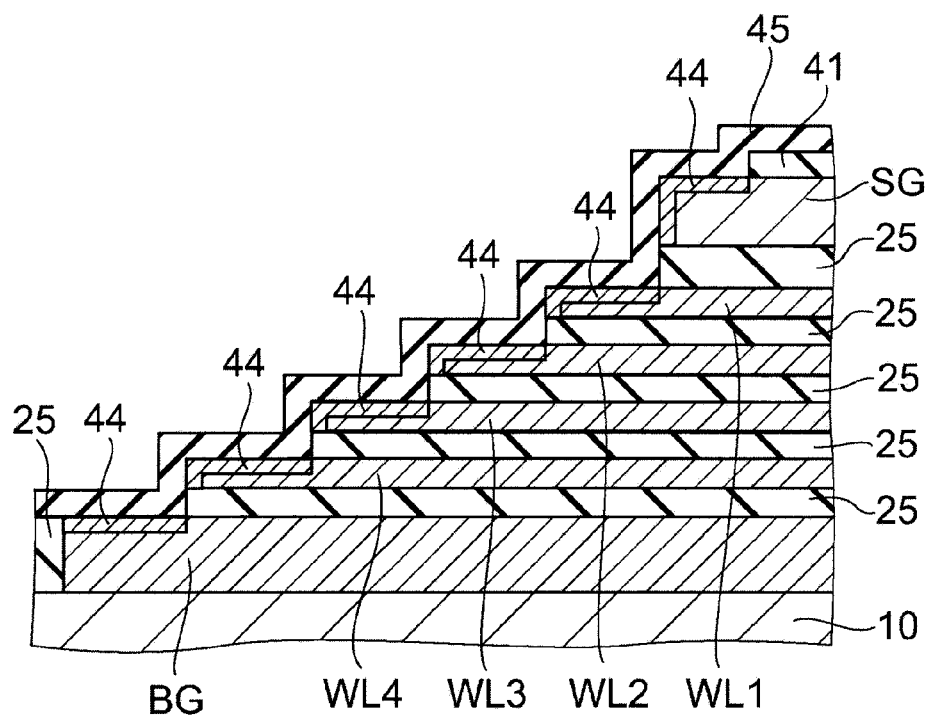
Figure 10B:
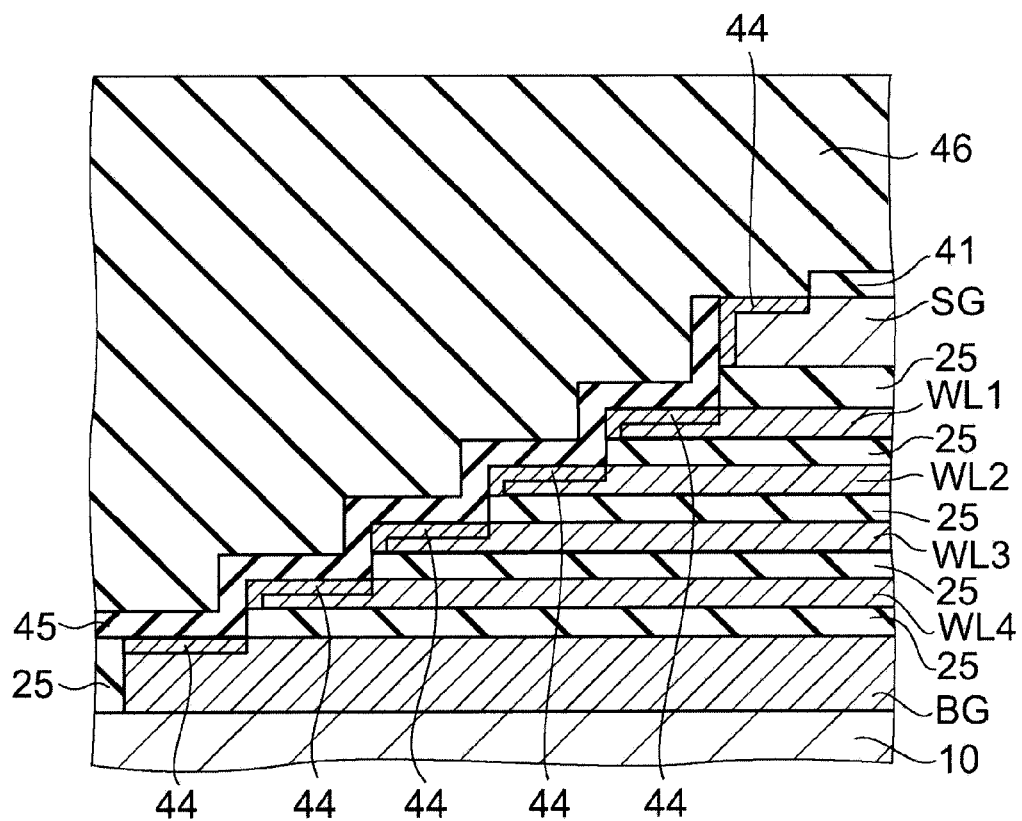

Next, as shown in FIG. 10A, a stopper layer 45 is formed so as to cover the staircase structure portion. The stopper layer 45 is illustratively made of silicon nitride. Subsequently, the stopper layer 45 above the select gate SG is selectively removed. Then, as shown in FIG. 10B, an interlayer insulating layer 46 is formed on the stopper layer 45 and the select gate SG. The interlayer insulating layer 46 is illustratively made of silicon oxide.

Subsequently, the upper surface of the interlayer insulating layer 46 is planarized. Then, a mask illustratively made of organic film, not shown, is formed thereon and used as a mask to selectively etch the interlayer insulating layer 46 and the stopper layer 45.

Thus, as shown in FIG. 11A, a plurality of contact holes 47 are formed in the interlayer insulating layer 46 and the stopper layer 45. The plurality of contact holes 47 have different depths from the upper surface of the interlayer insulating layer 46. Each of the contact holes 47 pierces the interlayer insulating layer 46 and the stopper layer 45 and reaches the titanium silicide 44 formed in the upper surface of the corresponding one of the select gate SG, the electrode layers WL1-WL4, and the back gate BG.

The plurality of contact holes 47 are formed simultaneously and collectively by RIE. Each of the silicon layers (select gate SG, electrode layers WL1-WL4, and back gate BG) in the contact region is processed into a staircase shape with the lower layers being longer. Hence, the plurality of contact holes 47 reaching the respective silicon layers can be collectively formed by the same etching process, and it achieves efficient processing.

Here, the stopper layer 45 made of silicon nitride functions as an etching stopper in etching the interlayer insulating layer 46 made of silicon oxide, and the titanium silicide 44 in the surface of each stage functions as an etching stopper in etching the stopper layer 45.

After the contact holes 47 are formed, a contact electrode 50 is provided inside the contact hole 47 as shown in FIG. 11B. Specifically, as shown in FIG. 3A, a first barrier film (such as titanium film) 51 is first formed on the inner wall of the contact hole 47, a second barrier film (such as titanium nitride film) 52 is formed inside the first barrier film 51, and a conductive material (such as tungsten) 53 is buried inside the second barrier film 52.

Here, as a comparative example, metal silicidation of the portion of each of the silicon layers (select gate SG, electrode layers WL1-WL4, and back gate BG) in contact with the contact electrode 50 may be performed by previously forming contact holes 47 and then turning the silicon layer surface exposed to the bottom of the contact hole 47 into metal silicide.

More specifically, after contact holes 47 are formed, a metal film is formed in the contact hole 47, including at the bottom of the contact hole 47, and annealed. Thus, the silicon layer surface in contact with the metal film at the bottom of the contact hole 47 is turned into metal silicide. Then, after the unreacted metal is removed, a contact electrode 50 is buried in the contact hole 47.

However, in this case, during RIE for forming contact holes 47, ions are implanted into the silicon layer surface exposed to the bottom of the contact hole 47. There is concern that this may modify the surface and interfere with metal silicidation reaction. Furthermore, the metal film may fail to be formed sufficiently at the bottom of a deep contact hole 47 with high aspect ratio, as compared with a shallow contact hole 47. This also causes concern about variation in the amount of metal silicide produced at the bottom depending on the depth of the contact hole 47. In other words, the lower electrode layer tends to have higher contact resistance to the contact electrode 50, which may consequently lead to variation in the characteristics of memory cells with the electrode layers WL1-WL4 serving as control gates.

In contrast, in this embodiment, as described above with reference to FIG. 9A, in the phase in which the staircase structure portion is exposed, the metal film 43 is formed, and the surface of each of the silicon layers is turned into metal silicide. Hence, a sufficient amount of metal can be supplied also to lower stages, and the thickness of the metal film 43 can be made nearly uniform between the upper stage side and the lower stage side. This can suppress the amount of produced metal silicide from varying between the upper stage side and the lower stage side. Hence, this embodiment can suppress the contact resistance to the contact electrode 50 from varying among the electrode layers WL1-WL4, and consequently suppress variation in the characteristics of memory cells with the electrode layers WL1-WL4 serving as control gates.

Furthermore, in this embodiment, because the silicon layer is turned into metal silicide before undergoing RIE for forming contact holes, the metal silicidation reaction can be favorably facilitated, and it achieves lower resistance.

In the aforementioned comparative example, when the stopper layer 45 made of silicon nitride is etched, the silicon layer not yet turned into metal silicide functions as an etching stopper. However, the etching selection ratio between silicon nitride and silicon is not significantly high. Hence, particularly when the electrode layer is thinned with the increase in the number of layers, etching may proceed through an electrode layer located at a shallow position, and the contact hole may reach another electrode layer below the corresponding electrode layer. Then, two different electrode layers are connected to one contact electrode and short-circuited to each other.

In contrast, in this embodiment, when the stopper layer 45 is etched, the metal silicide (such as titanium silicide 44) functions as an etching stopper. The etching selection ratio between silicon nitride and metal silicide is higher than the etching selection ratio between silicon nitride and silicon. Hence, progress of etching can be reliably stopped by the titanium silicide 44 formed in the upper surface of each of the electrode layers WL1-WL4. This can prevent the contact holes 47 from punching through the corresponding electrode layers WL1-WL4.

If each of the electrode layers WL1-WL4 is etched, the contact electrodes 50 are brought into contact with the electrode layers WL1-WL4 not only on the bottom surface but also on the side surface. If the amount of etching of the electrode layers WL1-WL4 is varied, the contact area, or contact resistance, between each of the electrode layers WL1-WL4 and the contact electrodes 50 is varied, which may lead to characteristics variation among memory cells.

In this embodiment, when the stopper layer 45 is etched, the amount of etching of each of the electrode layers WL1-WL4 from the upper surface can be reduced because titanium silicide 44 is resistant to etching. Consequently, variation in the contact area, or contact resistance, between each of the electrode layers WL1-WL4 and the contact electrodes 50 can be suppressed. This also contributes to the suppression of characteristics variation among memory cells.

Furthermore, as shown in FIG. 9A, because the metal film 43 is formed in the situation where the staircase structure is yet to be covered with the stopper layer 45 and the interlayer insulating layer 46, not only the upper surface but also the end surface of each of the electrode layers WL1-WL4 is in contact with the metal film 43. Hence, as shown in FIG. 3A, titanium silicide 44 is formed also in the end portion 60 of the electrode layer WL.

Figure 3B:
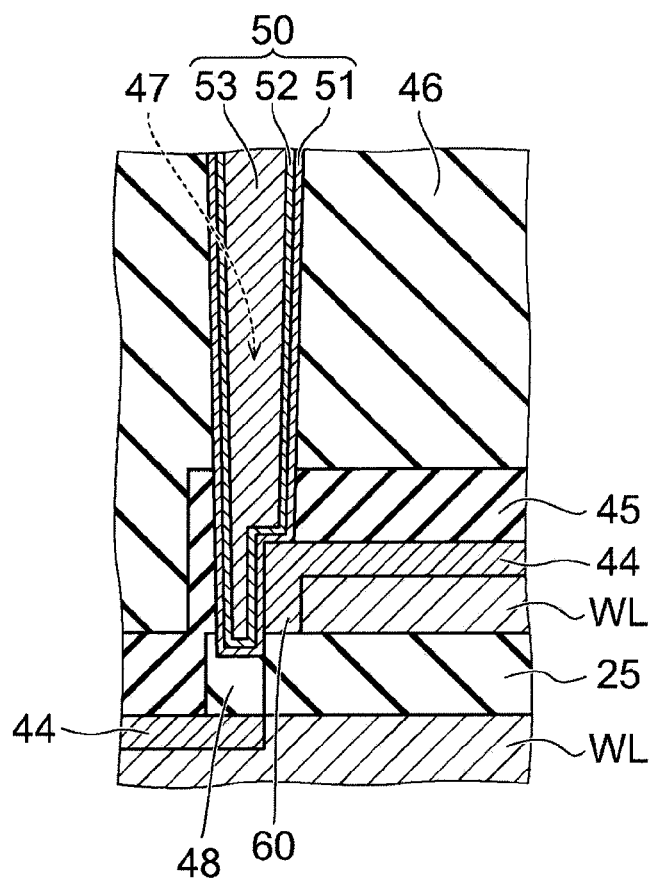

Thus, even if the contact hole 47 is displaced from above the electrode layer WL, the side portion of the contact electrode 50 can serve to ensure contact with the end portion 60 of the electrode layer WL as shown in FIG. 3B. This can suppress the decrease of the contact area therebetween.

In this case, by suitably controlling the etching time of the stopper layer 45, the portion of the contact hole 47 displaced from the electrode layer WL to be connected can be prevented from reaching another electrode layer WL therebelow.

Alternatively, as shown in FIG. 3B, it is also useful to provide, below the stopper layer 45, a stopper layer 48 made of a material (such as silicon oxide) different from silicon nitride constituting the stopper layer 45. This stopper layer 48 is provided near the step difference between each electrode layer WL and another electrode layer WL immediately thereabove. For instance, after the staircase structure portion is covered with the stopper layer 48, the stopper layer 48 can be left only on the end sidewall of each stage by anisotropic etch back.

In each electrode layer WL, the contact hole 47 is aligned with the position nearer to the end portion 60 than the portion provided with the stopper layer 48, and the stopper layer 45 is directly provided at that position without the intermediary of the stopper layer 48. In this structure, when the stopper layer 45 is etched, even if the contact hole 47 is displaced from the target electrode layer WL as shown in FIG. 3B, the stopper layer 48 made of a material different from that of the stopper layer 45 underlies the stopper layer 45 in the displaced portion. Hence, etching of the displaced portion can be stopped by the stopper layer 48, and the contact hole 47 can be reliably prevented from reaching another electrode layer WL therebelow.

The embodiments of the invention have been described with reference to examples. However, the invention is not limited thereto but can be variously modified within the spirit of the invention.

Figure 12:
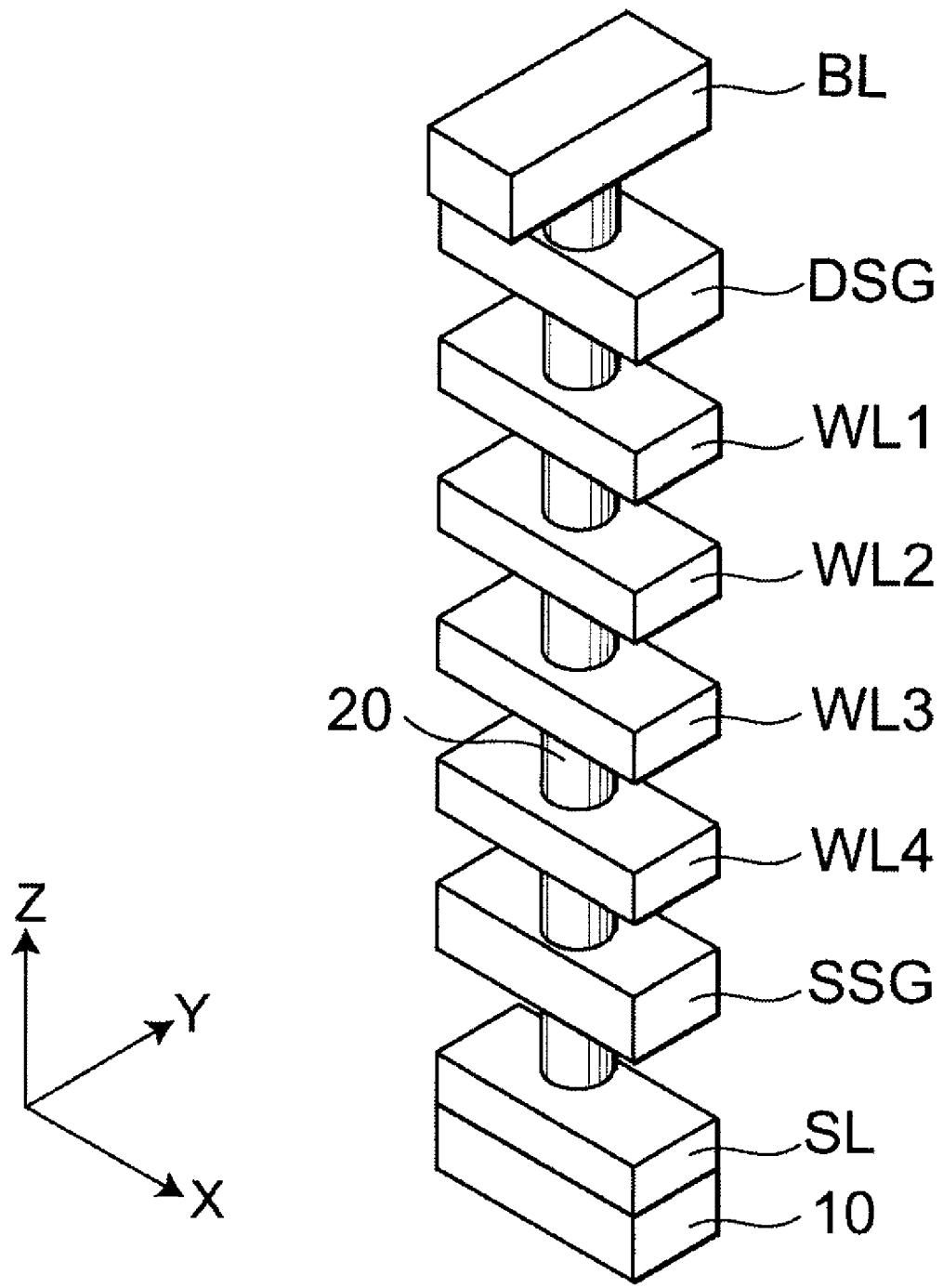
FIG. 12 is a schematic view illustrating another example of a memory string in the semiconductor device according to the embodiment of the invention.

The configuration of the memory string is not limited to the U-shape but may be an I-shape as shown in FIG. 12, which shows only the conductive portions and omits the insulating portions. In this structure, a source line SL is provided on a substrate 10, a source-side select gate (or lower select gate) SSG is provided thereon, electrode layers WL1-WL4 are provided thereon, and a drain-side select gate (or upper select gate) DSG is provided between the uppermost electrode layer WL1 and a bit line BL.

Furthermore, the insulating film structure between the electrode layer and the silicon body is not limited to the ONO structure but can illustratively be a two-layer structure of a charge storage layer and a gate insulating film.

The invention claimed is:

1. A semiconductor device manufacturing method comprising:
    stacking a plurality of electrode layers containing a semiconductor alternately with insulating layers;
    processing part of a multilayer body of the electrode layers and the insulating layers into a staircase shape and exposing a surface of the staircase-shaped electrode layers;
    forming a metal film in contact with the exposed electrode layers;
    reacting the semiconductor of the electrode layers with the metal film to form a metal compound in at least a portion of the electrode layers in contact with the metal film;
    removing an unreacted portion of the metal film;
    forming an interlayer insulating layer covering the staircase-shaped electrode layers after removing the unreacted portion of the metal film;
    forming a plurality of contact holes piercing the interlayer insulating layer, each of the contact holes reaching the metal compound of the electrode layer at a corresponding stage; and
    providing a plurality of contact electrodes inside the contact holes,
    wherein the processing part of the multilayer body into the staircase shape is performed by repetition of reducing planar size of a resist film formed above the multilayer body, and etching one of the insulating layers and one of the electrode layers in a portion not covered with the resist film and exposed from the resist film.

2. The method according to claim 1, wherein
    the semiconductor is silicon, and
    the metal compound formed in the electrode layers is a metal silicide.

3. The method according to claim 1, wherein the metal compound is formed in an upper surface and an end portion of the staircase-shaped electrode layers.

4. The method according to claim 1, wherein the unreacted portion is removed by wet processing.

5. The method according to claim 1, wherein the staircase-shaped electrode layers are covered with a stopper layer made of a material different from a material of the interlayer insulating layer after removing the unreacted portion of the metal film, and the interlayer insulating layer is formed on the stopper layer.

6. The method according to claim 1, wherein the plurality of contact holes having different depths from an upper surface of the interlayer insulating layer are collectively formed after planarizing the upper surface of the interlayer insulating layer.

7. The method according to claim 1, wherein the providing the contact electrodes includes:
    forming a conductive barrier film on inner walls of the contact holes; and
    burying a conductive material inside the barrier film in the contact holes.

8. The method according to claim 7, wherein the forming the barrier film includes:
    forming a titanium film on the inner walls of the contact holes; and
    forming a titanium nitride film inside the titanium film in the contact holes.

9. The method according to claim 1, further comprising:
    forming a memory hole in a memory cell array region in the multilayer body, the memory hole piercing the plurality of electrode layers and insulating layers;

forming an insulating film including a charge storage layer on an inner wall of the memory hole; and forming a semiconductor layer inside the insulating film in the memory hole.

10. The method according to claim 9, wherein the forming the insulating film includes:

forming a first silicon oxide film on the inner wall of the memory hole;

forming a silicon nitride film as the charge storage layer inside the first silicon oxide film in the memory hole; and forming a second silicon oxide film inside the silicon nitride film in the memory hole.

* * * * *